United States Patent [19]

Remington et al.

[11] Patent Number: 4,918,663
[45] Date of Patent: Apr. 17, 1990

[54] LATCH-UP CONTROL FOR A CMOS MEMORY WITH A PUMPED WELL

[75] Inventors: Scott I. Remington; Richard D. Crisp, both of Austin, Tex.

[73] Assignee: Motorola, Inc., Schaumburg, Ill.

[21] Appl. No.: 97,029

[22] Filed: Sep. 16, 1987

[51] Int. Cl.[4] ................... G11C 7/00; G11C 13/00
[52] U.S. Cl. ..................... 365/226; 365/190;
365/189.06; 307/530; 307/272.3; 307/296.5
[58] Field of Search .................. 365/189.09, 226, 190,
365/194, 181, 189.06; 307/530, 279, 272.3, 594,
540, 568, 296.5, 23.13

[56] References Cited

U.S. PATENT DOCUMENTS

| | | | |
|---|---|---|---|
| 4,296,340 | 10/1981 | Hovam | 307/279 |
| 4,670,861 | 6/1987 | Shu et al. | 365/226 |
| 4,698,789 | 10/1987 | Iizuka | 365/226 X |
| 4,727,518 | 2/1988 | Madland | 365/226 X |
| 4,752,699 | 6/1988 | Cranford, Jr. et al. | 365/226 |
| 4,769,784 | 9/1988 | Doluca et al. | 365/226 |
| 4,785,206 | 11/1988 | Hoshi | 307/530 |
| 4,791,317 | 12/1988 | Winnerg et al. | 307/272.3 |
| 4,791,613 | 12/1988 | Hardee | 365/189.09 |
| 4,797,857 | 1/1989 | Schreck et al. | 365/226 |
| 4,814,647 | 3/1989 | Tran | 365/226 |
| 4,849,654 | 7/1989 | Okada | 307/272.3 |

FOREIGN PATENT DOCUMENTS 0206785 12/1986 European Pat. Off. ............ 365/226

Primary Examiner—Stuart N. Hecker
Assistant Examiner—Alfonso Garcia
Attorney, Agent, or Firm—James L. Clingan, Jr.

[57] ABSTRACT

A CMOS DRAM has an array in a well which is pumped to a voltage greater than the power supply voltage. The transfer devices of the memory cells in the array are of a conductivity type opposite to that of the well. The transfer devices each have a source/drain of the opposite conductivity type to that of the well which is connected to a bit line. The bit line will tend to rise in voltage at power-up which has the potential of forward biasing the PN junction between the source/drain and the well. The bit line rise is due to a word-line rise the rate of which is controlled so that the bit line rise does not exceed the rise in array voltage. The bit lines are ensured of being separated in voltage at the beginning of the first active cycle by enabling the N channel portion of the sense amplifier during power-up. The P channel portion of the sense amplifier is disabled during power-up to avoid too rapid of a rise in voltage on the bit lines. Equalization of the bit lines is suppressed during the first cycle to avoid having the sense amplifier face the high current drain condition of little or no voltage differential at low voltage.

15 Claims, 3 Drawing Sheets

LATCH-UP CONTROL FOR A CMOS MEMORY WITH A PUMPED WELL

FIELD OF THE INVENTION

The present invention relates to CMOS integrated circuits, and more particularly, to CMOS memories in which a well is pumped to a voltage which is not between the positive and negative power supply voltages.

BACKGROUND OF THE INVENTION

There are known advantages to having a memory array contained within a well which is pumped to a voltage which is greater than the voltage of the positive power supply in the case of an N well and less than the voltage of the negative power supply voltage in the case of a P well. In present technology, especially MOS, the common positive power supply is nominally at 5 volts and the negative power supply is at ground. During power-up, however, there is a potential problem with the pumped-well approach. Because the array well is pumped, it is not directly connected to a power supply terminal. There is a lag time for the array well to reach its pumped voltage. During this lag time, the power supply voltage may exceed the array well voltage. If this happens, a PN junction may be forward biased and induce latch-up.

In the case of a dynamic random access memory (DRAM) that has P channel transistors as the transfer devices, the array will be in an N-type well which is biased to a voltage in excess of the positive power supply, for example, one and a half times the positive power supply. In such a case the P channel transfer devices have source/drains of P-type material which are connected to bit lines. If power-up is treated the same as normal, at least some of the bit lines are almost certainly going to be coupled to the positive supply. In such case, the source/drain of a transfer device may exceed the voltage of the array well by an amount sufficient to cause current to flow therebetween and induce latch-up.

One solution to this problem is disclosed in U.S. Pat. No. 4,670,861, Shu et al. The solution described therein was to force the bit lines to one half the positive power supply (Vcc) during power-up. A power-up circuit was used to provide information as to the relationship of the array voltage to Vcc. When the array-well voltage reached one P channel threshold voltage above Vcc, then the power-up circuit would release control. During the precharge cycle, the bit lines were normally brought to ½ Vcc so the power-up circuit affected the ½ Vcc bit line condition by forcing the memory into the same condition as is present during the precharge cycle during power-up.

This solution was available because a ½ Vcc source with relatively high current capacity was already present. For the type of DRAM in which the bit lines are equalized to obtain the ½ Vcc voltage, there is no such ½ Vcc voltage source available. Additionally, even limiting the bit lines to ½ Vcc does not necessarily ensure that the bit line voltage will not exceed the array-well voltage. The rise time of the bit lines could still be faster than that of the array well. Consequently, the solution thus requires a separately generated voltage which may not already be available and it may not be sufficient for controlling the rise rate of the bit lines with respect to the rate for the array well.

SUMMARY OF THE INVENTION

An object of the present invention is to provide an improved power-up circuit for a DRAM.

Another object of the invention is to provide an improved latch-up protection circuit for a CMOS memory.

Yet another object of the invention is to improve latch-up protection during power-up of a DRAM.

These and other objects are achieved in a CMOS DRAM having an array of memory cells located at intersections of word lines and bit lines including transfer device transistors of a first conductivity type formed in an array well of a second conductivity type, and characterized as having a power-up condition for a time period following application of power to a first power supply terminal. The memory has a pumping circuit, a word line driver, and a ramp control circuit. The pumping circuit pumps the array well to a predetermined voltage There is thus an array well rise time during the power-up condition. The word line driver raises the word lines to a predetermined voltage in response to entering the power-up condition. The voltage on the word lines driven by the driver means is characterized as having a word line rise time. The rise in word line voltage during the power-up condition is characterized as being capacitively coupled to the bit lines so that the bit lines rise in voltage at a bit line rise time. The ramp control circuit causes the word line rise time during the power-up condition to be at least a predetermined minimum which will result in the bit line rise time being greater than the array well rise time.

DESCRIPTION OF THE INVENTION

Figure 1:
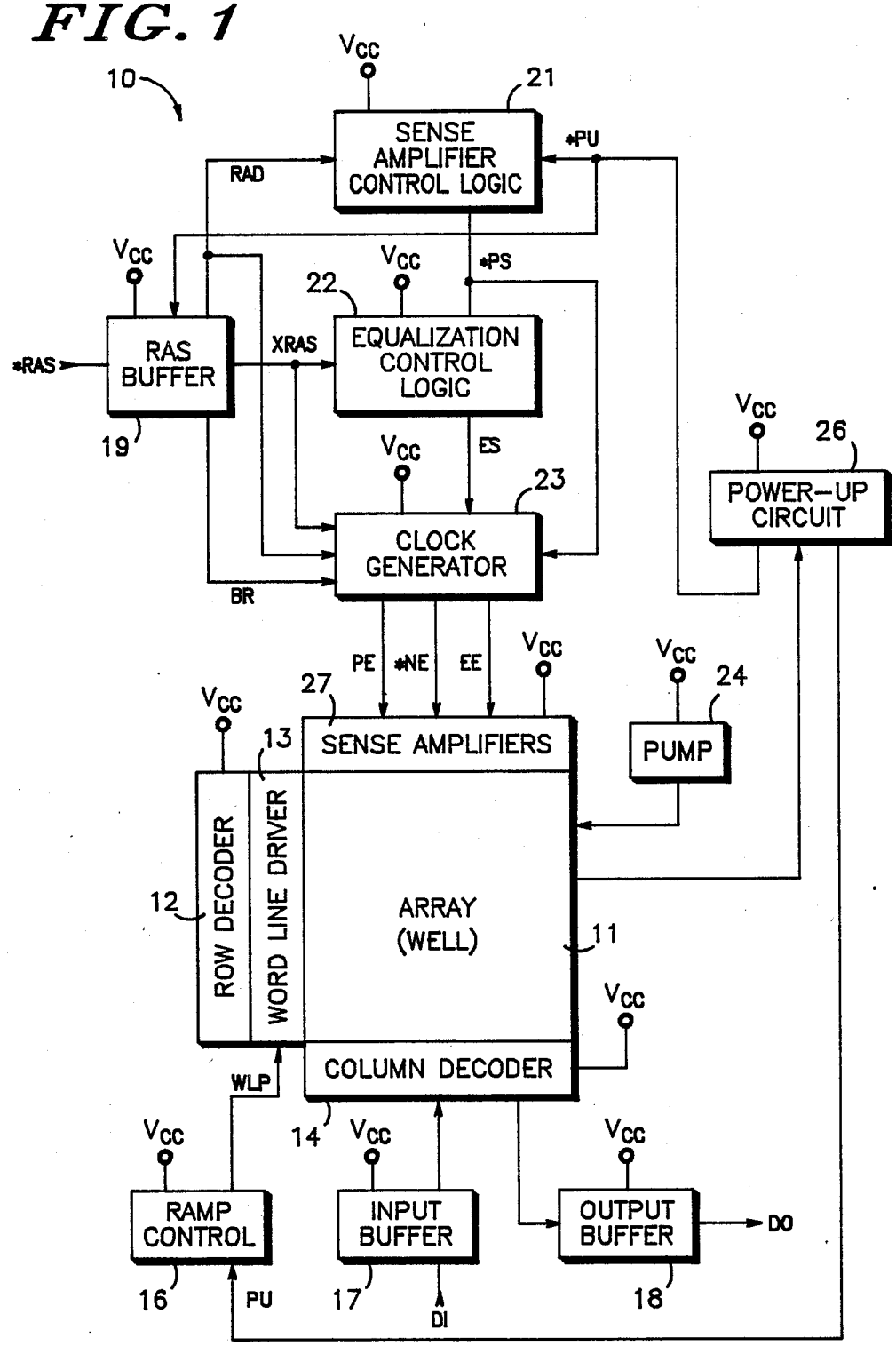
FIG. 1 is a block diagram of a memory according to a preferred embodiment of the invention.

Shown in FIG. 1 is a memory 10 comprised generally of an array 11, a row decoder 12, a word line driver 13, a column decoder 14, a ramp control circuit 16, an input buffer 17, an output buffer 18, a RAS buffer 19, a sense amplifier control logic circuit 21, an equalization control logic circuit 22, a clock generator 23, a pump 24, a power-up circuit 26, and sense amplifiers 27. All of elements shown in FIG. 1, except for array 11 and word line driver 13, are powered directly from a voltage present at a positive power supply terminal Vcc. The voltage present at Vcc may be, for example, 5 volts. Array 11 is comprised of conventional dynamic random access memory (DRAM) cells at intersections of word lines and bit lines. Each memory cell is comprised of a P channel transistor and a capacitor. The P channel transistors are formed in an N well which is pumped to one and a half (1½) times the voltage at Vcc by pump 24. Sense amplifiers 27 is comprised of individual sense amplifiers. Each of the individual sense amplifiers is connected to a pair of bit lines.

For a normal read operation after memory 10 has already been powered up, when an external signal

*RAS switches to a logic low, row decoder 12 selects a word line which is then enabled by word line driver 13. All of the memory cells connected to the enabled word line are enabled and output a voltage representative of their state onto the bit line to which they are connected. Sense amplifiers 27 detect the state of the enabled memory cells connected to the enabled word line by sensing the voltage of the bit line which is connected to the enabled memory cell. The other bit line is used as a reference voltage to establish a differential voltage between it and the bit line which is connected to the enabled memory cell. The voltage differential on the bit line pairs is not only detected but also amplified. After detection and amplification all of the bit line pairs have one bit line at Vcc and the other at ground. This refreshes the logic state of the all of the enabled memory cells. Column decoder 14 selects a bit line pair by coupling the bit line pair to output buffer 18 which provides an output signal DO in a logic state representative of the memory cell which was selected. For a normal write, the operation is much the same except that data is written onto a selected bit line pair via input buffer 17 representative of the logic state of a data input signal DI so that the enabled memory cell connected to a bit line of the selected bit line pair is written according to the logic state of signal DI.

At power-up, when Vcc is brought to the power supply voltage, there is a risk of latch-up because the N well which contains array 11 is pumped to 1½ Vcc. The bit lines may be brought to Vcc very quickly, whereas the array well may take longer to rise in voltage than the bit lines. Thus the bit lines may exceed the array well voltage, forward biasing a PN junction and thus inducing latch-up. This is avoided in memory 10 by the use of ramp control circuit 16, sense amplifier control logic 21, and equalization control logic 22.

The bit lines will tend to rise to Vcc by either the action of sense amplifiers 27 or word line driver 13. Word line driver 13 enables a word line by bringing it to a logic low because the memory cell has a P channel transistor as the transfer device. Thus the word lines are deselected by bringing them to a logic high at Vcc. Thus, during power-up, to set an initial condition, all of the word lines are brought to Vcc. There is capacitive coupling between the word lines and the bit lines so that bringing the word lines to Vcc also tends to raise the voltage on the bit lines. Ramp control circuit 16 ensures that the rise time of the voltage on the word lines is at least some predetermined minimum which is selected to ensure that the bit line voltage rise capacitively induced from the word lines is slower than pump 24 raises the array-well voltage. This effectively ensures that the bit lines will not rise above the array-well voltage by virtue of initializing the word lines.

Although there is a potential adverse affect on the bit line voltage from sense amplifiers 27, sense amplifiers 27 are actually used to advantage in this regard. Each individual sense amplifier of sense amplifiers 27 has a P channel portion and an N channel portion. The P channel portion provides Vcc onto the bit line which has the relatively higher voltage. The N channel portion provides ground onto the bit line which has the relatively lower voltage. During power-up, the P channel portion is disabled but the N channel portion is enabled. Disabling the P channel portion of all of the P channel portions of sense amplifiers 27 prevents sense amplifiers 27 from providing a positive voltage onto the bit lines. There is a positive voltage on the bit lines which is partially induced by the rise in word line voltage. The memory cell capacitor has one plate biased to about ½ Vcc. The rise to ½ Vcc of this capacitor plate also tends to induce a voltage rise on the bit lines. The rise in bit line voltage is also partially induced by the rise in well voltage. The N channel portions respond to this induced bit line voltage. These N channel portions are cross-coupled so that only one bit line will actually be pulled to ground. The other bit line will continue to rise in response to the rise in word line voltage, cell plate voltage, and well voltage. There is then a voltage differential established for each bit line pair. Thus, when memory 10 first responds to signal *RAS being at a logic low, which is known as the first cycle, the bit line pairs will be predisposed to a voltage differential. During the first cycle, the memory cells have no charge to output onto the bit lines. Thus, the bit line which is connected to an enabled cell will be the same as the bit line which is used as a reference unless the bit lines are predisposed to a voltage differential. Furthermore, the equalized voltage would be less than Vcc/2. A low voltage input in which there is no differential causes the sense amplifier to resolve to one state or the other very slowly. A sense amplifier which has both inputs at the same voltage will draw much more current than one which receives a voltage differential.

Under normal conditions, the bit lines are equalized prior to enabling a memory cell. A voltage differential is established on each bit line pair as a result of one of the bit lines of each bit line pair having a memory cell connected thereto being enabled. This equalization is a very useful part of the normal sensing operation. This equalization before the first cycle, however, would create the problem of both inputs to a sense amplifier being at the same low voltage. In memory 10, the equalization of bit lines is suppressed until after the first cycle. This ensures that there will be substantial voltage differential which can be easily resolved. After the first cycle, the bit lines will be equalized at Vcc/2 so that even if a word line is enabled which has cells which have not been previously accessed, the sense amplifiers will not draw excessive current in order to resolve. The high current problem does not occur when both inputs are at Vcc/2 and does not occur when there is a good voltage differential but does occur when there is no voltage differential at a low voltage.

Clock generator 23 provides a P channel enable signal PE, an N channel enable signal *NE, and an equalization enable signal EE to sense amplifiers 27. Signal PE is generated to enable the P channel portions of sense amplifiers 27. Signal *NE is generated to enable the N channel portions of sense amplifiers 27. Signal EE is generated to enable the equalization of bit lines. Signals PE, *NE, and EE are all generated in response to external signal *RAS switching to a logic low. Signal EE is a pulse. Signals PE and *NE are generated when the pulse of signal EE is terminated. Power-up circuit 26, which is coupled to array well 11 and Vcc, operates as a detection means for detecting the power-up condition. Power-up circuit 26 generates a power-up signal PU at power-up. When the array-well voltage reaches a P channel threshold voltage above Vcc, signal *PU switches to a logic high. Signal *PU is a logic low at the beginning of power-up. While signal *PU is a logic low, sense amplifier control logic circuit 21 provides P channel suppression signal *PS at a logic low. After signal *PU switches to a logic high, logic circuit 21 becomes responsive to a RAS delay signal RAD. Signal RAD is generated at a logic high a predetermined delay time following signal *RAS switching to a logic low. After signal *PU has switched to a logic high and signal RAD has switched to a logic high, signal *PS is latched at a logic high. Clock generator 23 suppresses signal PE while signal *PS is a logic low. Equalization control logic circuit provides an equalization suppression signal ES to clock generator 23 at a logic high so long as signal *PS is received at a logic low. Clock generator 23 suppresses signal EE so long as signal ES is received at a logic high. Signal ES will switch to a logic low in response to a RAS precharge signal *XRAS switching to a logic high. Signal *XRAS switches to a logic high in response to signal *RAS switching to a logic high. Signal *XRAS switches to a logic high at the termination of the active cycle. Since signal *PS does not switch to a logic high until the beginning of the first active cycle, logic circuit 22 does not switch signal ES to a logic low until the termination of the first active cycle. Thus signal EE is suppressed during the first active cycle which ensures that equalization of the bit lines is suppressed for the first cycle.

Figure 2:
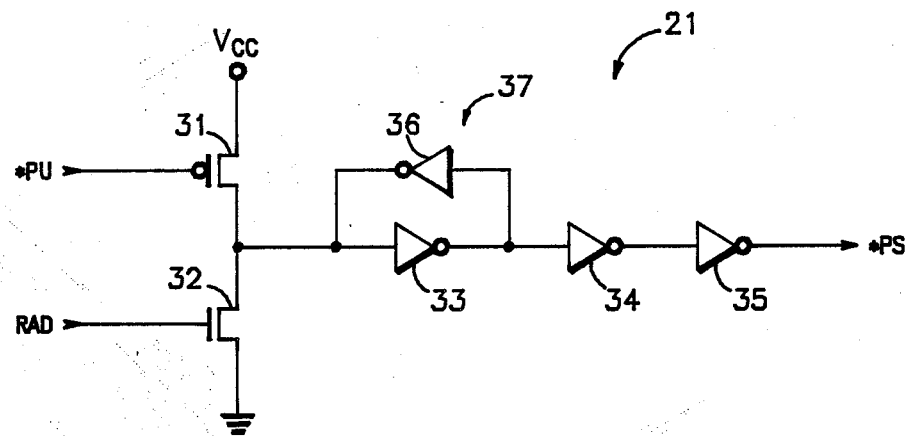
FIG. 2 is a circuit diagram of a circuit useful in implementing the memory of FIG. 1.

Shown in FIG. 2 is a circuit diagram of sense amplifier control logic circuit 21 comprised of a P channel transistor 31, an N channel transistor 32, an inverter 33, an inverter 34, an inverter 35, and an inverter 36. Transistor 31 has a source connected to Vcc, a gate for receiving signal *PU, and a drain. Transistor 32 has a drain connected to the drain of transistor 31, a gate for receiving signal RAD, and a source connected to ground. Inverter 33 has an input connected to the drains of transistors 31 and 32, and an output. Inverter 34 has an input connected to the output of inverter 33, and an output. Inverter 35 has an input connected to the output of inverter 34 and an output for providing signal *PS. Inverter 36 has an input connected to the output of inverter 33, and an output connected to the input of inverter 33. Inverters 33 and 36 form a latch 37. When signal *PU is provided at a logic low, the input of inverter 33 is forced to a logic high which, via inverters 34 and 35, forces signal *PS to be a logic low.

Signal *PU forces RAS buffer 19 to provide signal RAD at a logic low so long as signal *PU is a logic low. Transistor 32 thus cannot be conductive until transistor 31 is non-conductive. After signal *PU switches to a logic high, the input of inverter 33 will be forced to a logic low in response to signal RAD being a logic high. Inverter 33 responds by forcing signal *PS to a logic high. Latch 37 ensures that signal *PS will remain at a logic high even after signal RAD has switched to a logic low.

Figure 3:
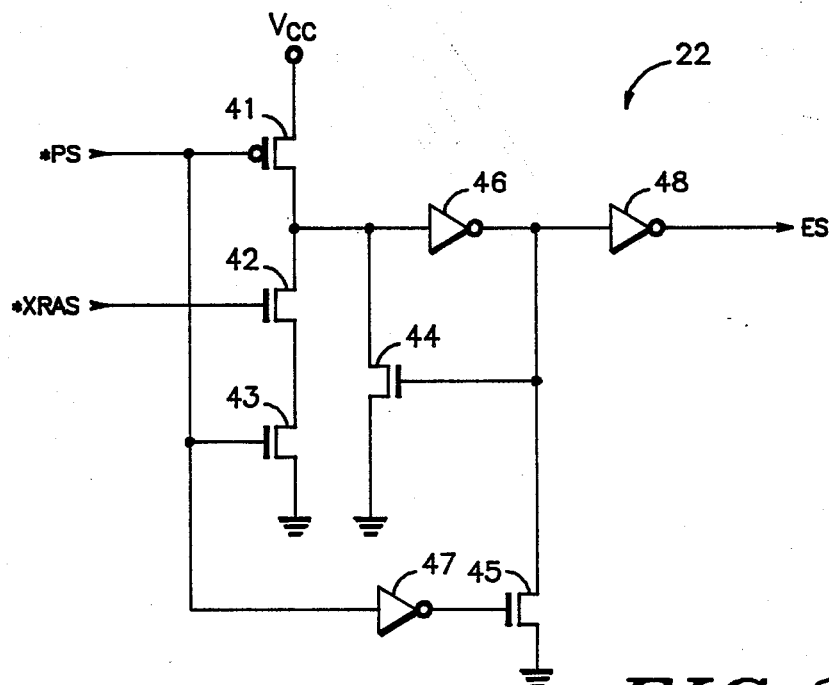
FIG. 3 is a circuit diagram of a circuit useful in implementing the memory of FIG. 1.

Shown in FIG. 3 is a circuit diagram of equalization control logic circuit 22 comprised of a P channel transistor 41, an N channel transistor 42, an N channel transistor 43, an N channel transistor 44, an N channel transistor 45, an inverter 46, an inverter 47, and an inverter 48. Transistor 41 has a source connected to Vcc, a gate for receiving signal *PS, and a drain. Transistor 42 has a drain connected to the drain of transistor 41, a gate for receiving signal *XRAS, and a source. Transistor 43 has a drain connected to the source of transistor 42, a gate for receiving signal *PS, and a source connected to ground. Inverter 47 has an input for receiving signal *PS, and an output. Transistor 45 has a gate connected to the output of inverter 47, a source connected to ground, and a drain. Inverter 46 has an input connected to the drains of transistors 41 and 42, and an output connected to the drain of transistor 45. Transistor 44 has a gate connected to the output of inverter 46, a source connected to ground, and a drain connected to the input of inverter 46. Inverter 48 has an input connected to the output inverter 46, and an output for providing signal ES. When signal *PS is a logic low, the input to inverter 46 and the gate of transistor 45 are forced to a logic high. Both transistor 45 and inverter 46 thus pull the input to inverter 48 to ground and thus force signal ES to a logic high. Signal *PS switching to a logic high causes transistors 41 and 45 to be non-conductive and transistor 43 to be conductive. After signal *PS has switched to a logic high, the input to inverter 46 will switch to a logic low in response to signal *XRAS switching to a logic high. Signal *XRAS, is active during the precharge cycle. Signal *PS switches to a logic high in after entering the first active cycle so signal *XRAS is a logic low when signal *PS switches to a logic high. The equalization pulse, which is suppressed by signal ES at a logic high, would already occurred after signal *PS has switched to a logic high. Thus, signal ES need only be held to a logic high for a short time following entry into the active cycle to prevent equalization of the bit lines during that cycle. The input to inverter 46 is floating during the time signal *PS switches to a logic high and signal *XRAS switches to a logic high. This is not a problem because under normal operating conditions, external signal *RAS will switch to a logic high very quickly after signal *PS has switched to a logic high so that the input to inverter 46 will not have changed state. In the event that signal *RAS does stay at a logic low for a relatively long time so that the input to inverter 46 does leak to a logic low, this will occur long after the equalization would have occurred so that signal ES would already have performed its function of suppressing equalization of the bit lines during the first active cycle.

Figures 4, 5:
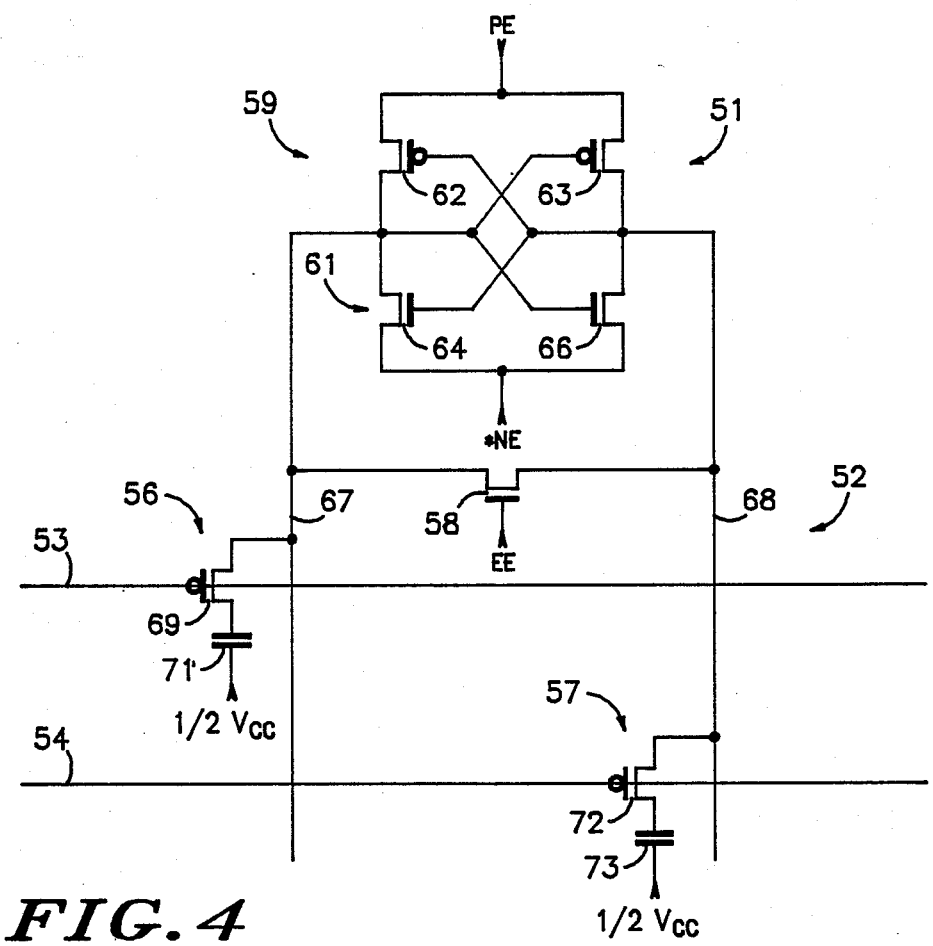
FIG. 4 is a circuit diagram of a circuit useful in implementing the memory of FIG. 1.
FIG. 5 is a circuit diagram of a circuit useful in implementing the memory of FIG. 1.

Shown in FIG. 4 is a sense amplifier 51, bit line pair 52, a word line 53, a word line 54, a memory cell 56, a memory cell 57, and an equalization transistor 58. This is a conventional configuration. The only difference between sense amplifier 51 and a sense amplifier of the prior art is the timing of signals PE, *NE, and EE received by sense amplifier 51. Sense amplifier 51 is one of the individual sense amplifiers of sense amplifiers 27. Sense amplifier 51 has a P channel portion 59 enabled by signal PE and an N channel portion 61 enabled by signal NE. P channel portion 59 comprises a P channel transistor 62 and a P channel transistor 63. N channel portion 61 comprises an N channel transistor 64 and an N channel transistor 66. Bit line pair 52 comprises a bit line 67 and a bit line 68. Memory cell 56 comprises a P channel transistor 69 and a capacitor 71. Memory cell 57 comprises a P channel transistor 72 and a capacitor 73. Memory cell 56 has an input/output connected to bit line 67 and is enabled via word line 53. Memory cell 57 has an input/output connected to bit line 68 and is enabled by word line 54. Equalization transistor 58 is an N channel transistor having a first current electrode connected to bit line 67, a second current electrode connected to bit line 68, and a control electrode for receiving signal EE. Transistor 58 utilizes the bilateral nature of MOS transistors whereby the function of source or drain can vary between the two current electrodes. Memory cells 56 and 57 are an example of two memory cells from array 11. Transistors 69 and 72 also utilize the bilateral nature of MOS transistors and act as transfer devices for memory cells 56 and 57. Memory cells 56 and 57 are formed in the array well which is N-type and which is biased by pump 24. The connection to bit line 67 by transistor 69 and the connection to bit line 68 by transistor 72 are connections of bit lines to P-type material which from PN junctions with the array well. These are the PN junctions which are desirably not forward biased because if forward biased, could cause latch-up. Capacitors 71 and 73 each have terminal which is held at a reference voltage which is approximately ½ Vcc. The advantages of this approach are known. The ½ Vcc voltage is supplied by an on-chip reference generator which has a relatively low current capacity and would not be useful for precharging bit lines. Additionally, it would be undesirable to have the capacitor reference voltage subject to sudden voltage changes which occur as a result of the large currents drawn during a bit line precharge.

P channel portion 59, which is enabled by signal PE, is disabled during power-up because signal PE is suppressed to a logic low during power-up by signal *PS. Transistor 62 has a gate connected to bit line 68, a drain connected to bit line 67, and a source for receiving signal PE. Transistor 63 has a gate connected to bit line 67, a drain connected to bit line 68, and a source for receiving signal PE. Signal PE is a logic high when it is active and high impedance when it is inactive. When signal *PS is a logic low, clock generator is forced to provide signal PE at a high impedance state so that P channel portion 59 is disabled during power-up. N channel portion 61, on the other hand, is enabled during power-up. Transistor 64 has a drain connected to bit line 67, a gate connected to bit line 68, and a source for receiving signal *NE. Transistor 66 has drain connected to bit line 68, a gate connected to bit line 67, and a source for receiving signal *NE. Signal *NE enables N channel portion 61 when signal *NE is a logic low and disables N channel portion 61 when signal *NE is high impedance. Signal *NE is held to a logic low during power-up by clock generator 23. Clock generator 23 is responsive to buffered RAS signal which is held inactive while signal *PU is active. Under normal operation, both N channel portion 61 and P channel portion 59 are enabled a predetermined delay time after the active cycle begins and continue to be enabled during the following precharge cycle. These P and N channel portions 59 and 61 are disabled at the beginning of an active cycle while bit lines 67 and 68 are equalized.

During power-up, N channel portion 61 is enabled. During power-up, word lines 53 and 54 rise in voltage. This rise in word line voltage is capacitively coupled to bit lines 67 and 68. Due to N channel portion 61 being enabled, sensing will occur. Even though bit lines 67 and 68 will tend to rise together, there will be at least some system imbalance which will cause N channel portion 61 to go to one of its two stable states so that one of bit lines 67 and 68 will be held to ground potential while the other rises in voltage due to the rise in word line voltage, cell plate voltage, and well voltage. After power-up has been accomplished and signal *PS has switched to a logic low so that signal PE is no longer suppressed, the first active cycle is begun. Normally at the beginning of an active cycle, signal EE is active and causes transistor 58 to equalize the voltage on bit lines 67 and 68. This action of equalizing is suppressed so that there is a significant voltage differential on the bit lines for sensing by sense amplifier 51 which does not cause a significant increase in current consumption by sense amplifier 51. Shortly after the active cycle begins, signals PE and *NE are activated so that both N channel and P channel portions are enabled. As a result, one of bit lines 67 and 68 is driven to Vcc and the other is held at ground. For cycles which follow, at the beginning of each active cycle transistor 58 is activated and bit lines 67 and 68 are equalized at ½ Vcc. Although this may result in very little voltage variation on the bit lines if no data has been written into the enabled memory cells which are connected to one of the bit lines of bit line pair 52, the bit lines are at a sufficiently high voltage to avoid an excessive current drain. The high current drain condition is a relatively low voltage with little or no voltage differential between the bit lines. The potential for this condition is during the first active cycle when the bit lines are induced to rise in voltage, but the voltage to which the bit lines rise can vary substantially. Thus, the bit lines may rise to only about one volt which would present a high current drain condition for sense amplifier 51. This is solved by enabling N channel portion 61 during power-up and suppressing equalization during the first active cycle.

Shown in FIG. 5 is a circuit diagram of ramp control circuit 16 comprised of a P channel transistor 76 and a P channel transistor 77. Transistor 76 has a source connected to Vcc, a gate connected to ground, and a drain for outputting a word line power supply signal WLP. Transistor 77 has a source connected to Vcc, a gate for receiving signal PU, and a drain connected to the drain of transistor 76 for also outputting signal WLP. Signal WLP provides the power for word line driver 13. The rate of rise of signal WLP at power-up is controlled by the magnitude of the gain of transistor 77 which is selected for the particular desired rise rate. Transistor 77 is not enabled until power-up is completed as indicated by signal PU switching to a logic low. Signal PU is provided at a logic high until the array well has reached a P channel threshold voltage above Vcc at which time signal PU switches to a logic low. In response to termination of the power-up condition, the impedance of transistor 77 is less than the impedance of transistor 76. Transistor 77 is of substantially higher gain than transistor 76 so that transistor 77 supplies most of the current during normal operation but supplies no current during power-up. Thus, during power-up, the word lines rise no faster than some rise time selected by selecting the gain of transistor 76 but during normal operation relatively high gain transistor 77 provides current to word line driver 13 so that performance is not degraded by controlling the rise time during power-up.

While the invention has been described in a particular embodiment, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

We claim:

1. A CMOS DRAM having an array of memory cells located at intersections of word lines and bit lines including transfer device transistors of a first conductivity type formed in an array well of a second conductivity type, comprising:

a plurality of sense amplifiers each coupled to a pair of bit lines, each said sense amplifier having a first portion for being enabled by being coupled to a first power supply terminal and a second portion for being enabled by being coupled to a second power supply terminal;

power-up detection means, coupled to the first power supply terminal and the array well, for detecting a power-up condition; and power-up control means, coupled to the power-up detection means, for disabling the first portions of the sense amplifiers during the power-up condition and enabling the second portions of the sense amplifiers during the power-up condition.

2. The CMOS DRAM of claim 1 further characterized as alternating between precharge and active cycles, and further comprising equalization means, coupled to the bit lines, for equalizing the bit lines in response to the memory entering the active cycle, and wherein said power-up control means is further characterized as inhibiting the equalization means during the active cycle which immediately follow termination of the power-up condition.

3. The CMOS DRAM of claim 2 further comprising:
pumping means for pumping the array well to a predetermined voltage and characterized as having an array well rise time during the power-up condition;
word line driver means for raising the word lines to a predetermined voltage during the power-up condition, whereby the voltage on the word lines driven by the driver means is characterized as having a word line rise time, said rise in word line voltage during the power-up condition characterized as being capacitively coupled to the bit lines so that the bit lines rise in voltage at a bit line rise time; and
ramp control means, coupled to the word line driver means, for slowing the word line rise time during the power-up condition to make the bit line rise time slower than the array well rise time.

4. The CMOS DRAM of claim 1 further comprising:
pumping means for pumping the array well to a predetermined voltage and characterized as having an array well rise time during the power-up condition;
word line driver means for raising the word lines to a predetermined voltage during the power-up condition, whereby the voltage on the word lines driven by the driver means is characterized as having a word line rise time, said rise in word line voltage during the power-up condition characterized as being capacitively coupled to the bit lines so that the bit lines rise in voltage at a bit line rise time; and
ramp control means, coupled to the word line driver means, for slowing the word line rise time during the power-up condition to make the bit line rise time slower than the array well rise time.

5. A CMOS DRAM having an array of memory cells located at intersections of word lines and bit lines including transfer device transistors of a first conductivity type formed in an array well of a second conductivity type, and characterized as having a power-up condition for a time period following application of power to a first power supply terminal, comprising:
pumping means for pumping the array well to a predetermined voltage and characterized as having an array well rise time during the power-up condition;
word line driver means for raising the word lines to a predetermined voltage during the power-up condition, whereby the voltage on the word lines driven by the driver means is characterized as having a word line rise time, said rise in word line voltage during the power-up condition characterized as being capacitively coupled to the bit lines so that the bit lines rise in voltage at a bit line rise time; and
ramp control means, coupled to the word line driver means, for slowing the word line rise time during the power-up condition to make the bit line rise time slower than the array well rise time.

6. The CMOS DRAM of claim 5 wherein the ramp control means comprises:
first impedance means for coupling the first power supply terminal to the word line driver means via a first impedance; and
second impedance means for coupling the first power supply terminal to the word line driver means via a second impedance in response to termination of the power-up condition, said second impedance being less than said first impedance.

7. A CMOS DRAM having an array of memory cells located at intersections of word lines and bit lines including transfer device transistors of a first conductivity type formed in an array well of a second conductivity type, each transfer device transistor coupled to one bit line of a pair of bit lines, comprising:
power-up detection means, coupled to a first power supply terminal and the array well, for detecting a power-up condition; and
means for clamping one and only one bit line of each bit line pair to a second power supply terminal during the power-up condition.

8. The CMOS DRAM of claim 7 further characterized as alternating between precharge and active cycles, and further comprising equalization means, coupled to the bit lines, for equalizing the bit lines in response to the memory entering the active cycle, and wherein said power-up control means is further characterized as inhibiting the equalization means during the active cycle which immediately follows termination of the power-up condition.

9. The CMOS DRAM of claim 8 further comprising:
pumping means for pumping the array well to a predetermined voltage and characterized as having an array well rise time during the power-up condition;
word line driver means for raising the word lines to a predetermined voltage during the power-up condition, whereby the voltage on the word lines driven by the driver means is characterized as having a word line rise time, said rise in word line voltage during the power-up condition characterized as being capacitively coupled to the bit lines so that the bit lines rise in voltage at a bit line rise time; and
ramp control means, coupled to the word line driver means, for slowing the word line rise time during the power-up condition to make the bit line rise time slower than the array well rise time.

10. The CMOS DRAM of claim 7 further comprising:
pumping means for pumping the array well to a predetermined voltage and characterized as having an array well rise time during the power-up condition;
word line driver means for raising the word lines to a predetermined voltage during the power-up condition, whereby the voltage on the word lines driven by the driver means is characterized as having a word line rise time, said rise in word line voltage during the power-up condition characterized as being capacitively coupled to the bit lines so that the bit lines rise in voltage at a bit line rise time; and
ramp control means, coupled to the word line driver means, for slowing the word line rise time during the power-up condition to make the bit line rise time slower than the array well rise time.

11. A CMOS DRAM having an array of memory cells located at intersections of word lines and bit lines including transfer device transistors of a first conductivity type formed in an array well of a second conductivity type, and further having a plurality of sense amplifiers each coupled to a pair of bit lines, each said sense amplifier having an N channel portion and a P channel portion; a method for preventing latch-up comprising the steps of:

detecting a power-up condition;

disabling the P channel portions of the sense amplifiers during the power-up condition; and enabling the N channel portions of the sense amplifiers during the power-up condition.

12. The method of claim 11 further comprising the steps of:

pumping the array well to a predetermined voltage at a rate characterized during the power-up condition as a rise in voltage of the array well; and raising the word lines to a predetermined voltage in response to the memory entering the power-up condition at a predetermined rise time which causes the voltage rise on the bit lines to occur more slowly than the rise in voltage of the array well.

13. A CMOS DRAM having an array of memory cells located at intersections of word lines and bit lines including transfer device transistors of a first conductivity type formed in an array well of a second conductivity type, each transfer device transistor coupled to one bit line of a pair of bit lines, a method for preventing latch-up, comprising the steps of:

detecting a power-up condition;

clamping one and only one bit line of each bit line pair to a second power supply terminal during the power-up condition.

14. The method of claim 13 further comprising the steps of:

pumping the array well to a predetermined voltage at a rate characterized during the power-up condition as a rise in voltage of the array well; and raising the word lines to a predetermined voltage in response to the memory entering the power-up condition at a predetermined rise time which causes the voltage rise on the bit lines to occur more slowly than the rise in voltage of the array well.

15. A CMOS DRAM having an array of memory cells located at intersections of word lines and bit lines including transfer device transistors of a first conductivity type formed in an array well of a second conductivity type, said word lines and bit lines capacitively coupled so that a rise in voltage on the word lines causes a rise in voltage on the bit lines, said DRAM further characterized as having a power-up condition for a time period following application of power to a first power supply terminal, a method for preventing latch-up comprising:

pumping the array well to a predetermined voltage at a rate characterized during the power-up condition as a rise in voltage of the array well; and raising the word lines to a predetermined voltage in response to the memory entering the power-up condition at a predetermined rise time which causes the voltage rise on the bit lines to occur more slowly than the rise in voltage of the array well.

\* \* \* \* \*